United States Patent [19]
Kawasaki et al.

[11] Patent Number: 5,175,447
[45] Date of Patent: Dec. 29, 1992

[54] MULTIFUNCTIONAL SCAN FLIP-FLOP

[75] Inventors: Soichi Kawasaki, Tokyo; Takashi Yoshimori; Keiji Matsumoto, both of Yokohama, all of Japan

[73] Assignee: Kabushiki Kaisha Toshiba, Kawasaki, Japan

[21] Appl. No.: 687,616

[22] Filed: Apr. 19, 1991

[30] Foreign Application Priority Data

Apr. 20, 1990 [JP] Japan .................................. 2-104520

[51] Int. Cl.⁵ ...................... H03K 19/00; H03K 3/289
[52] U.S. Cl. ................................. 307/480; 307/272.2; 307/465; 307/279; 307/452
[58] Field of Search ..................... 307/480-481, 307/465, 452, 272.1, 272.2, 279, 269

[56] References Cited

U.S. PATENT DOCUMENTS

| | | |
|---|---|---|
| 4,540,903 | 9/1985 | Cooke et al. ..................... 307/272.2 |
| 4,779,009 | 10/1988 | Tsunoi et al. ..................... 307/272.2 |
| 4,961,013 | 10/1990 | Obermeyer, Jr. et al. ......... 307/480 |
| 5,003,204 | 3/1991 | Cushing et al. .................. 307/272.2 |

Primary Examiner—Edward P. Westin
Assistant Examiner—Andrew Sanders
Attorney, Agent, or Firm—Foley & Lardner

[57] ABSTRACT

A multifunctional scan flip-flop having a normal function and a scan function, including: a first latch used for a normal function for latching input data applied to a data input terminal during a normal function operation, the latch operation being carried out synchronous with a clock applied to a clock input terminal; a second latch used for a scan function for holding scan data applied to a scan data input terminal during a scan function operation; and a delay circuit for delaying one of the input data and the clock relative to the other, the delay operation being carried out in accordance with the H/L level of the scan data held by the second latch.

11 Claims, 8 Drawing Sheets

MULTIFUNCTIONAL SCAN FLIP-FLOP

FIELD OF THE INVENTION

The present invention relates to a multifunctional scan flip-flop as a sequential logic circuit in a standard logic device. More particularly, the present invention relates to a multifunctional scan flip-flop constituted as a storage element dedicated for use by a scan testing method which is one of the testability techniques for semiconductor logic circuits.

BACKGROUND OF THE INVENTION

Figure 1:
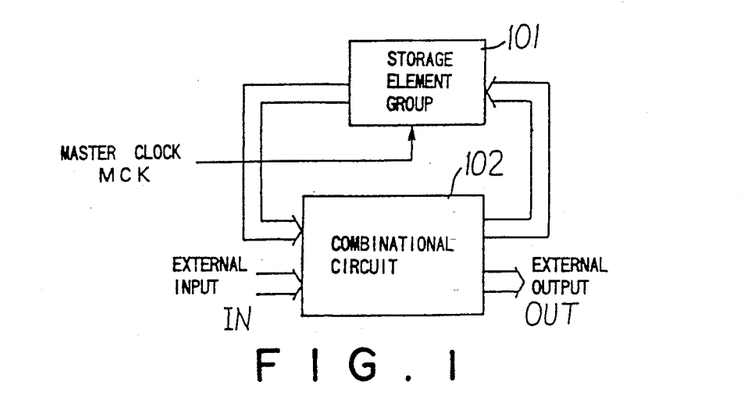
FIG. 1 is a block diagram showing a general sequential circuit.

First, the definition of a data hold time of a general synchronous circuit and its verification method will be described with reference to a block diagram of a sequential logic circuit shown in FIG. 1. As shown in FIG. 1, an external input IN is received by a combinational circuit 102, and outputted as an external output OUT. A storage element group 101 used with this combinational circuit 102 is supplied with a particular master clock MCK for driving the storage element group 101. Consider the testing of a timing specification of a synchronous circuit such as shown in FIG. 1. In this testing, it is necessary to check the timing specification, particularly of the so-called data setup time and data hold time with respect to the storage element group 101.

Figure 2:
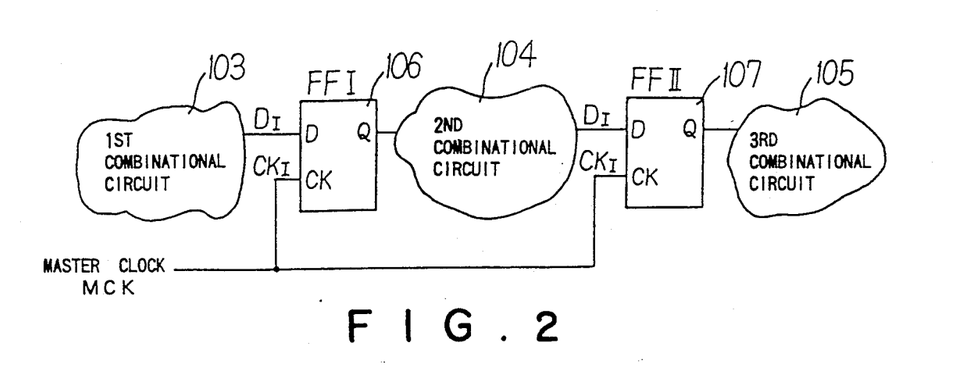
FIG. 2 is a block diagram showing a particular example of the circuit shown in FIG. 1, using flip-flops.

FIG. 2 is a particular example of a sequential logic circuit wherein a storage element group shown in FIG. 1 is replaced with flip-flops which are typical storage elements. As shown in FIG. 2, data from a first combinational circuit 103 is inputted to a data input terminal D of a D-type flip-flop (FFI) 106. The data output terminal Q of FFI 106 is coupled via a second combinational circuit 104 to the data input terminal D of a D-type flip-flop (FFII) 107. The data output terminal Q of FFII 107 is connected to a third combinational circuit 105. Master clocks MCK are supplied to the clock input terminals CK of FFI and FFII 106 and 107.

Figure 3:
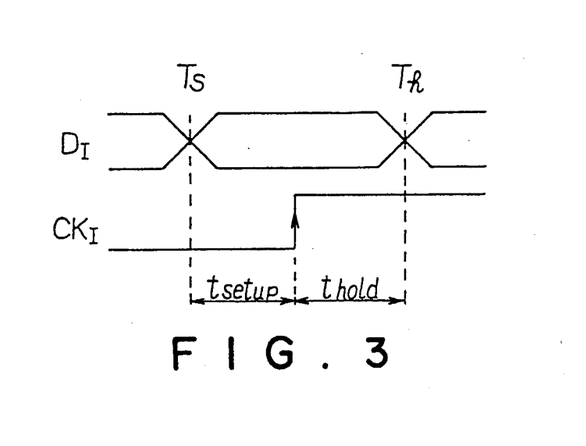
FIG. 3 is a timing chart showing the operation of a general flip-flop.

A verification of the timing specification of FFI and FFII 106 and 107 serving as storage elements, i.e., a verification of the data setup times and data hold times, will be discussed. The data setup times Tsetup and data hold times Thold definitely determined by FFI and FFII 106 and 107 themselves are shown in the timing chart of FIG. 3. Specifically, a signal $D_I$ supplied to the data input terminal D of the D-type flip-flop 106, 107 should be established at a time Ts led at least by the setup time Tsetup relative to the signal $CK_I$ supplied to the clock input terminal CK of the D-type flip-flop 106, 107. In addition, the data input $D_I$ should not change until a time Th delayed at least by the hold time Thold with respect to the clock input CK.

A verification of such timing specification for the whole of the synchronous circuit shown in FIG. 2 will be described. It is possible to verify a margin of a setup timing while changing the frequency of a synchronous clock signal. Namely, as the frequency of the clock signal is higher, the margin of the setup timing finally reaches a limit. At this limit, the data input $D_I$ to the flip-flop is established after the time Ts shown in FIG. 3. In this manner, the margin limit can be externally verified. On the contrary, it is not possible to externally verify the data hold time. The reason for this is as follows. For example, consider a verification of a data hold timing margin for the D-type flip-flop 107. In this case, data input to the data input terminal D of the D-type flip-flop 107 is synchronous with the master clock MCK. Therefore, even if the frequency of the clock signal is changed, the condition of the data hold time after the clock signal cannot be changed. This is the reason for verification inability.

The verification of a timing margin of data setup times and data hold times is very important to ensure the stable operation of a large scale synchronous logic circuit. Miniaturization techniques for large scale integrated logic circuits are advancing more and more. It is therefore becoming difficult to distribute synchronous clock signals at a high timing precision. This means that a skew of a clock signal is likely to occur among storage elements in a synchronous logic circuit. From the viewpoint of this or other reasons, it has been desired to carry out timing verification more reliably and correctly. Conventionally, however, since the verification method for the data hold time has not been provided, there has been a possibility of timing faults during mass production processes and in markets. Such timing faults inevitably lead again to circuit change and development, considerably affecting development scheduling and cost.

Furthermore, from the viewpoint of improving the function of such a scan flip-flop, it is desirable to make the input and output data changeable.

SUMMARY OF THE INVENTION

The present invention has been made in consideration of the above circumstances. It is an object of the present invention to provide a multifunctional scan flip-flop having an improved function and capable of reliably carrying out the timing verification of a synchronous logic circuit.

According to one aspect of the present invention, there is provided a multifunctional scan flip-flop having a normal function and a scan function, comprising: a first latch used for a normal function for latching input data applied to a data input terminal during a normal function operation, the latch operation being carried out synchronous with a clock applied to a clock input terminal; a second latch used for a scan function for latching scan data applied to a scan data input terminal during a scan function operation, the latch operation being carried out in synchronism with the clock; and a delay circuit for delaying one of the input data and the clock relative to the other, the delay operation being carried out in accordance with the H/L level of the scan data latched by the second latch.

DESCRIPTION OF THE PREFERRED EMBODIMENTS

Embodiments of the present invention will be described with reference to the accompanying drawings.

Figure 4:
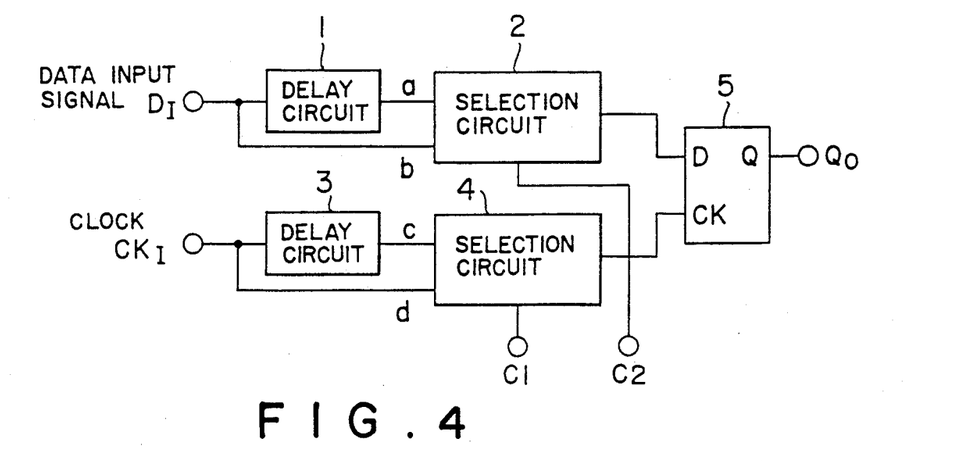
FIGS. 4 to 6 are block diagrams showing concepts embodiments of the present invention.

FIG. 4 is a block diagram of an embodiment of the present invention, particularly showing the functional block of a flip-flop having a function of testing a data setup time and data hold time. As shown in FIG. 4, a data input $D_I$ is applied directly, or via a delay circuit 1, to a selection circuit 2. The selection circuit 2 selects one of the two signals, and supplies the selected one to the data input D of a D-type flip-flop 5. A clock input $CK_I$ is applied directly, or via a delay circuit 3, to a selection circuit 4. The selection circuit 4 selects one of the two signals, and supplies the selected one to the clock input CK of the D-type flip-flop 5. The data output Q of the D-type flip-flop 5 is outputted as a data output Qo. A signal C2 is applied to the selection circuit 2, and a signal C1 is applied to the selection circuit 4, respectively as a control signal.

In general, for testing the data setup time and data hold time of a flip-flop (FF), the timing of data or clock signal is externally changed to check if the flip-flop operates normally or abnormally. A flip-flop (FF) built in a large scale integrated circuits is impossible to be controlled externally and directly. In contrast, with the circuit shown in FIG. 4, a signal delayed by a predetermined time is added to a data line or a clock line to test the data setup time or data hold time. In this case also, it is checked if the flip-flop operates normally or abnormally.

For example, if a data hold time is to be tested, the clock signal $CK_I$ is delayed relative to the data input $D_I$. Two approaches are possible. According to one approach, an input terminal b of the selection circuit 2 is selected by the signal C2, and an input terminal d of the selection circuit 4 is selected by the signal C1. At the time of testing, an input terminal c of the selection circuit 4 is selected by the signal C1. In this manner, the clock signal $CK_I$ delayed by a predetermined time by the delay circuit 3 is inputted. According to the other approach, the selection circuits 2 and 4 normally select the input terminals a and c, respectively. At the time of testing, the input terminal b of the selection circuit 2 is selected by the signal C2. In this manner, the data input $D_I$ led by a predetermined time from the clock signal $CK_I$ is inputted.

On the contrary, in testing the data setup time, the clock signal $CK_I$ is led relative to the data input $D_I$. In this case also, two approaches are possible. According to one approach, the selection circuits 2 and 4 select the input terminals a and c. At the time of testing, the selection circuit 4 selects the input terminal d. In this manner, an input timing of the clock signal is led. According to the other approach, the selection circuits 2 and 4 select the input terminals b and d, respectively. At the time of testing, the selection circuit 2 selects the input terminal a.

Figure 5:
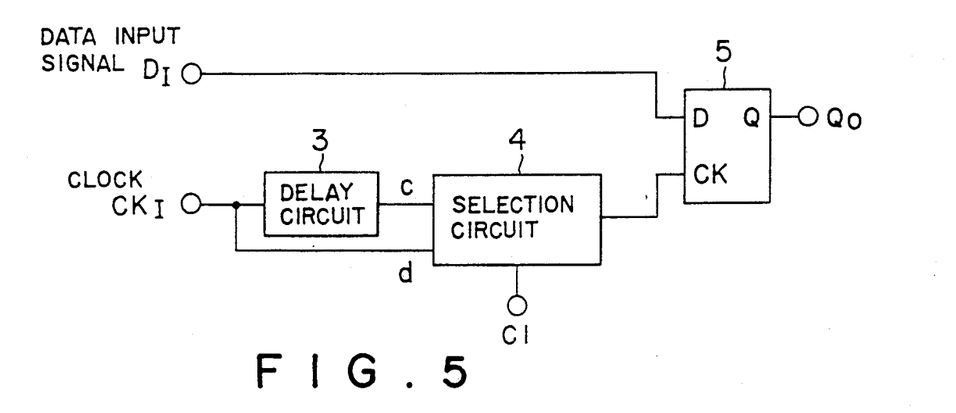
Figure 6:
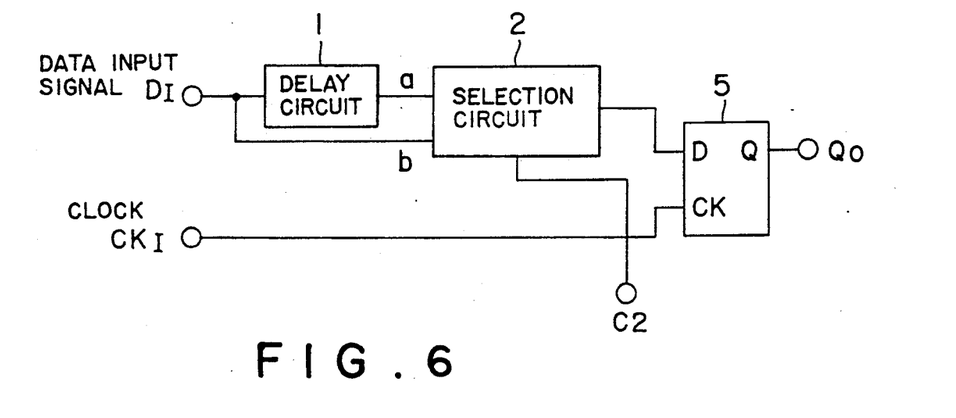

In order to delay the clock signal $CK_I$ relative to the data input $D_I$, circuits shown in FIGS. 5 and 6 may also be used. In FIG. 5, the clock $CK_I$ is delayed, whereas in FIG. 6 the data input $D_I$ is delayed.

Figure 7:
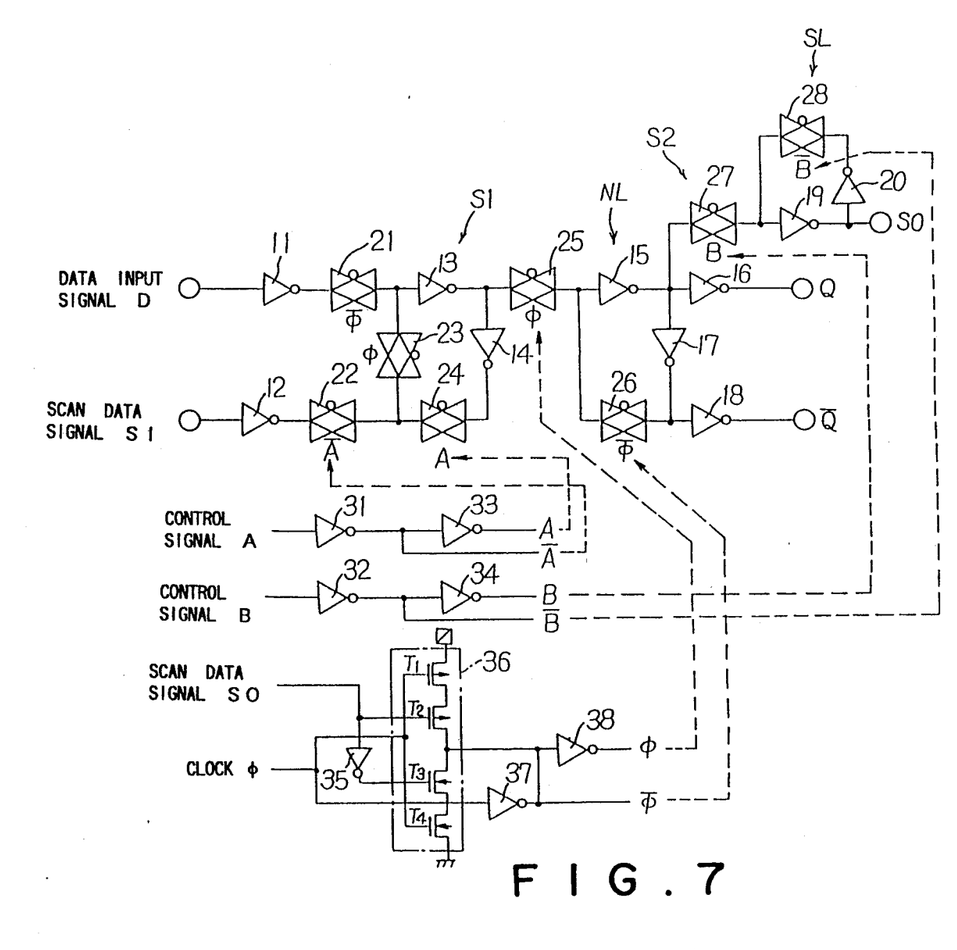
FIG. 7 is a circuit diagram showing a first embodiment of the present invention.

FIG. 7 shows a particular example of the concept of the circuit shown in FIG. 5 fabricated on a semiconductor integrated circuit. The circuit shown in FIG. 7 does not perfectly correspond to the circuit shown in FIG. 5, because of the circuit shown in FIG. 5 only shows the concept of the present invention. The circuit shown in FIG. 7 allows to test a data hold time by using a scan flip-flop and by supplying a control signal (scan data signal SO) from a scan latch SL which is not used in a normal operation. In this embodiment, the clock signal can be delayed by a predetermined time from that in the normal operation, to thereby allow to test the data hold time.

As shown in FIG. 7, a data input D is outputted as a data output Q via an inverter 11, transmission gate 21, inverter 13, transmission gate 25, and inverters 15 and 16. A clock $\phi$ is supplied to the transmission gate 21, and a clock $\phi$ is supplied to the transmission gate 25. An output of the inverter 13 is inputted via the inverter 14 and transmission gates 24 and 23 to the inverter 13, thereby forming a latch circuit S1 during the normal operation. A control signal A is supplied to the transmission gate 24, and the clock $\phi$ is supplied to the transmission gate 23. An output of the inverter 15 is inputted via the inverter 17 and transmission gate 26 to the inverter 15, thereby forming a latch circuit NL during the normal operation. The clock $\phi$ is supplied to the transmission gate 26. An output of the inverter 17 becomes an output $\overline{Q}$ via an inverter 18. A scan data signal SI is inputted to an interconnection between the transmission gates 23 and 24 via an inverter 12 and transmission gate 22. A control signal $\overline{A}$ is supplied to the transmission gate 22. An output of the inverter 15 is derived as the scan data signal SO via a transmission gate 27 and inverter 19. An output of the inverter 19 is inputted via an inverter 20 and transmission gate 28 to the inverter 19, thereby forming a scan latch SL. A control signal B is supplied to the transmission gate 28, and a control signal $\overline{B}$ is supplied to the transmission gate 27.

The control signal A is supplied via an inverter 31 to the circuit as the control signal $\overline{A}$. An output of the inverter 31 is also supplied via an inverter 33 to the circuit as the control signal A. The control signal B is supplied via an inverter 32 to the circuit as the control signal $\overline{B}$. An output of the inverter 32 is also supplied via an inverter 34 to the circuit as the control signal B. The scan data signal SO is inputted directly, or via an inverter 35, to transistors T2 and T3 of a tri-state buffer 36, respectively. The clock $\phi$ is inputted to transistors T1 and T4 of the buffer 36 and to an inverter 37. An output of the buffer 36 is applied to an inverter 38. The input terminal of the inverter 38 and the output terminal of the inverter 37 are connected together. Clocks $\phi$ and $\phi$ are outputted from the output terminals of the inverters 38 and 37, respectively. These clocks $\phi$ and $\phi$ are supplied to the circuit. In FIG. 7, only a partial flow of these signals is shown by way of example.

In FIG. 7, the circuit constructed of the tri-state buffer 36 and inverters 35, 37, and 38 has both the functions of delay circuits and selection circuits shown in FIG. 4. When the scan data signal SO takes an L state, the clock $\phi$ is supplied from the tri-state buffer 36 and inverter 37 connected in parallel with the buffer 36. With this arrangement, the drive capacity of the clock $\phi$ increases. This state corresponds to the case wherein the clock $\phi$ is supplied without passing the delay circuit. Alternatively, when the scan data signal SO takes an H state, the tri-state buffer 36 enters an intermediate state (high impedance) among the three states. Accordingly, the clock $\phi$ is supplied only from the inverter 37. In this case, the drive capacity of the clock $\phi$ decreases. This state corresponds to the case wherein the clock is supplied after passing through the delay circuit. Namely, during the normal operation, the scan data signal SO is set to an L state to supply the clock φ having no delay to the circuit, whereas during the data hold time testing, the scan data signal SO is set to an H level to supply the clock φ having a delay to the circuit.

Figure 8:
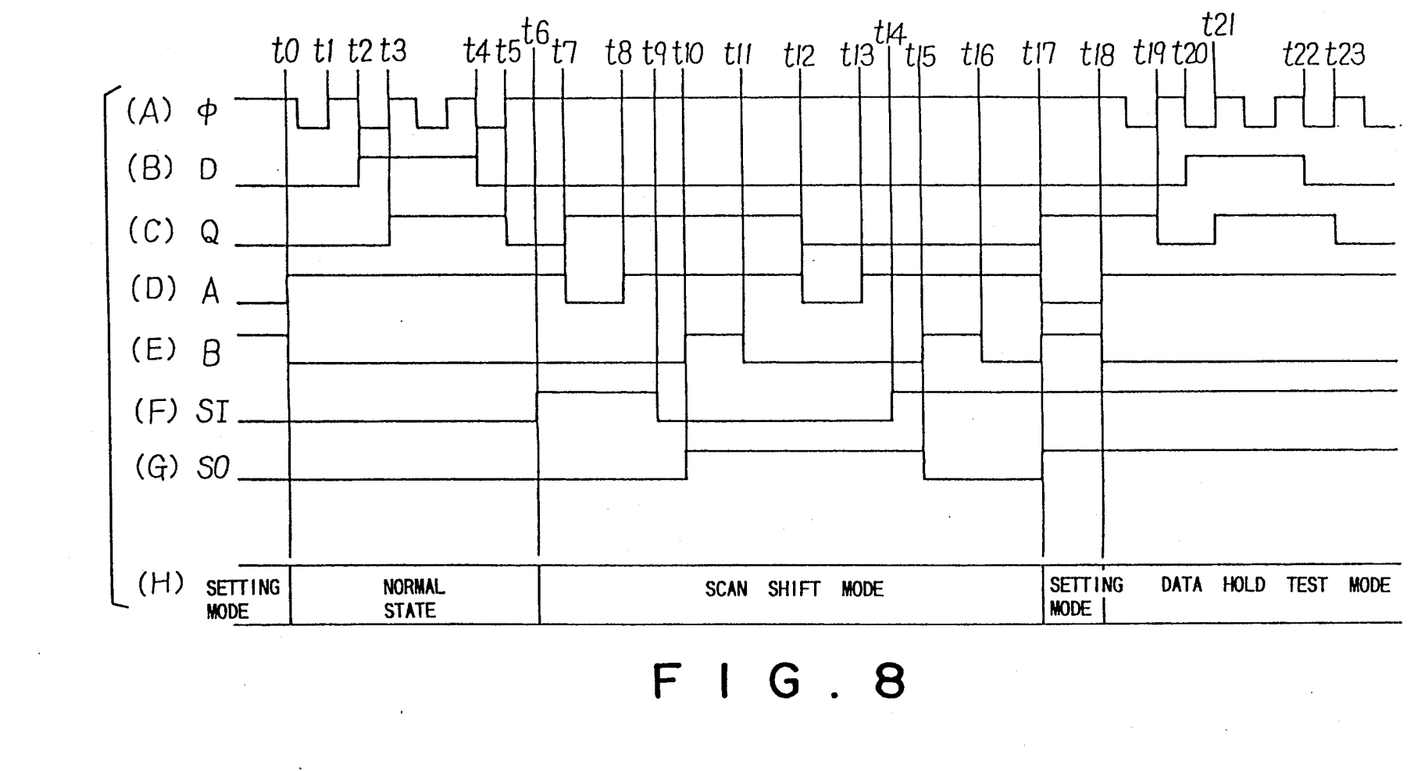
FIG. 8 is a timing chart showing the operation of the circuit of FIG. 7.

Next, the operation of the circuit shown in FIG. 7 and constructed as above will be described with reference to the timing chart shown in FIG. 8. FIG. 8(A) indicates the clock φ, FIG. 8(B) indicates the data input D, FIG. 8(C) indicates the data output Q, FIG. 8(D) indicates the control signal A, FIG. 8(E) indicates the control signal B, FIG. 8(F) indicates the scan data signal SI, FIG. 8(G) indicates the scan data signal SO, and FIG. 8(H) indicates the operation mode.

First, in the setting mode up to time t0, the clock φ is set to an H state, the control signal A is set to an L state, and the control signal B is set to the H state. As a result, in the scan flip-flop portion from the input side at which the scan data signal SI is applied to the output side from which the scan data signal SO is outputted, a through path is provided via a route of the inverter 12, transmission gate 22, transmission gate 23, inverter 13, transmission gate 25, inverter 15, transmission gate 27, and inverter 19. The L data from the scan data signal SI therefore becomes the scan data signal SO.

Next, at time t0, the control signal A is set to the H state, and the control signal B is set to the L state. As a result, it becomes possible to hold the scan data signal SO (L data) in the scan latch SL constituted by the inverter 20, transmission gate 28, and inverter 19, thus providing the normal operation condition.

Under this condition, as the clock φ is inputted during the period from time t1 to time t5, the data input D taking the H state at time t2 and the L state at time t4 is stored, in synchronism with the falling edges of the clock φ at times t3 and t5, in the latch NL during the normal operation, and outputted as the data output Q, the latch NL being constructed of the inverter 17, transmission gate 26, and inverter 15.

Next, at time t6, the scan data signal SI is set to the H state to enter the scan shift mode. Under this condition, the control signal A is set to the L state at time t7 so that the scan data signal SI becomes the data output Q through the route of the inverter 12, transmission gates 22 and 23, inverter 13, transmission gate 25, and inverters 15 and 16.

At the next time t8, even when the control signal A is again set to the H state, the scan data signal SI is latched by the latch circuit S1 constructed of the inverter 14, transmission gate 24, transmission gate 23, and inverter 13. Therefore, even when the scan data signal SI is set to the L state at the next time t9, the H state of the data output Q will not change.

Next, at time t10, the control signal B is set to the H state so that the H state of the data output Q is transferred to the signal path S2 constructed of the transmission gate 27, and inverter 19 and the scan data signal SO takes the H state.

At the next time t11, even when the control signal B is again set to the L state, the scan data signal SO is latched by a signal path (latch SL) constructed of the inverter 20, transmission gate 28, and inverter 19. Then, during the period from time t12 to time t13, the control signal A is set to the L state to fetch the scan data signal SI. At this time, since the scan data signal SI takes the L state, the L state is outputted as the data output Q. However, the scan data signal SO holds its H state because it is latched by the latch SL.

Even when the scan data signal SI is set to the H state at time t14 and the control signal B is set to the H state at time t15, the scan data signal SO takes the L state because the data output Q takes the L state. This state is latched when the control signal B is again set to the L state at time t16.

In the above manner, the scan shift mode continues while holding the clock φ under the H state and alternately inputting an L pulse as the control signal A and an H pulse as the control signal B.

During the period from time t17 to t18, there is provided a setting mode for testing the data hold time. At time t17, the control signal A is set to the L state and the control signal B is set to the H state. As a result, the scan data signal SI of the H state is outputted as the data output Q via the signal path constructed of the inverter 12, transmission gate 22, transmission gate 23, inverter 13, transmission gate 25, inverter 15, and inverter 16. The scan data signal SI is also transferred as the scan data signal SO via the transmission gate 27, and inverter 19. The data output Q and scan data signal SO are latched at time t18 when the control signal A is again set to the H state and the control signal B is again set to the L state. As a result, the data output Q and scan data signal SO are set to the H level. After this time t18, there is provided a data hold test operation. Since the scan data signal SO takes the H state, the clock φ is supplied to the circuit after passing through the delay circuit.

As the clock φ rises at the next time t19, the data input D of the L state is outputted as the data output Q. At time t20, the data input D takes the H state, and at time t21 it takes the L state. Then, the data output Q is held during the period from the rising edge at time t21 to the rising edge at time t23, respectively of the clock φ.

During the data hold time testing, the clock φ is supplied after passing through the circuit having a delay time defined by specifications. As a result, the flip-flop operates under the severe condition of the hold operation. If the flip-flop operates normally under this condition, it is judged that a sufficient margin is present for the hold operation of the flip-flop.

Figure 9:
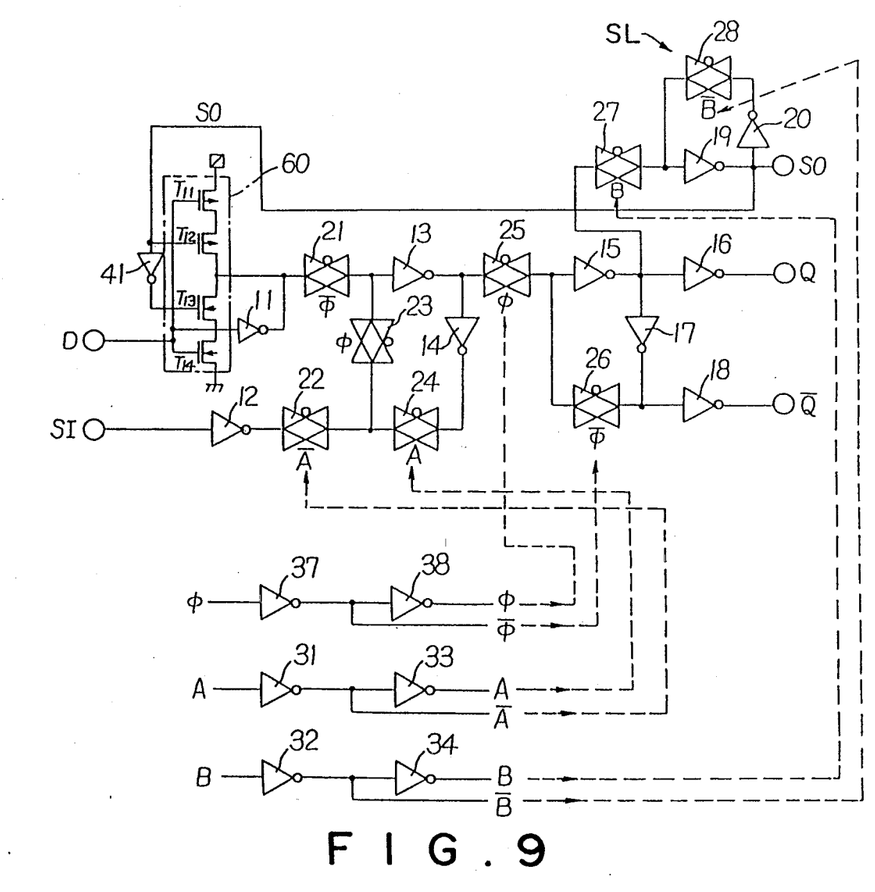
FIG. 9 is a circuit diagram showing a second embodiment of the present invention.

FIG. 9 is a particular example of the concept of the circuit shown in FIG. 6. The circuit shown in FIG. 9 does not perfectly correspond to the circuit shown in FIG. 6, because of the circuit shown in FIG. 6 only shows the concept of the present invention. In this example, testing the data hold time becomes possible by deriving a control signal from a scan latch which is not used in the normal operation. Referring to FIG. 9, signal delay is assigned to a data input signal D. A scan data signal SO is directly inputted to a transistor T12 of a tri-state buffer 60, and via an inverter 41 to a transistor T13. The tri-state buffer 60 is connected in parallel with an inverter 11 to which a data input terminal D is connected, thereby providing a difference between transfer times of the data input signal D. During the normal operation, the scan data signal SO is set to an H state, and the data input signal D is derived from the inverter 11 so that it has a delay time. During the data hold time test, the scan data signal SO is set to an L state to make the tri-state buffer 60 operate so that the data input signal D is derived therefrom without a delay time. In the circuit shown in FIG. 9, since the data input signal D is delayed during the normal operation, this circuit is not applied to a system which requires high speed operation.

Figure 10:
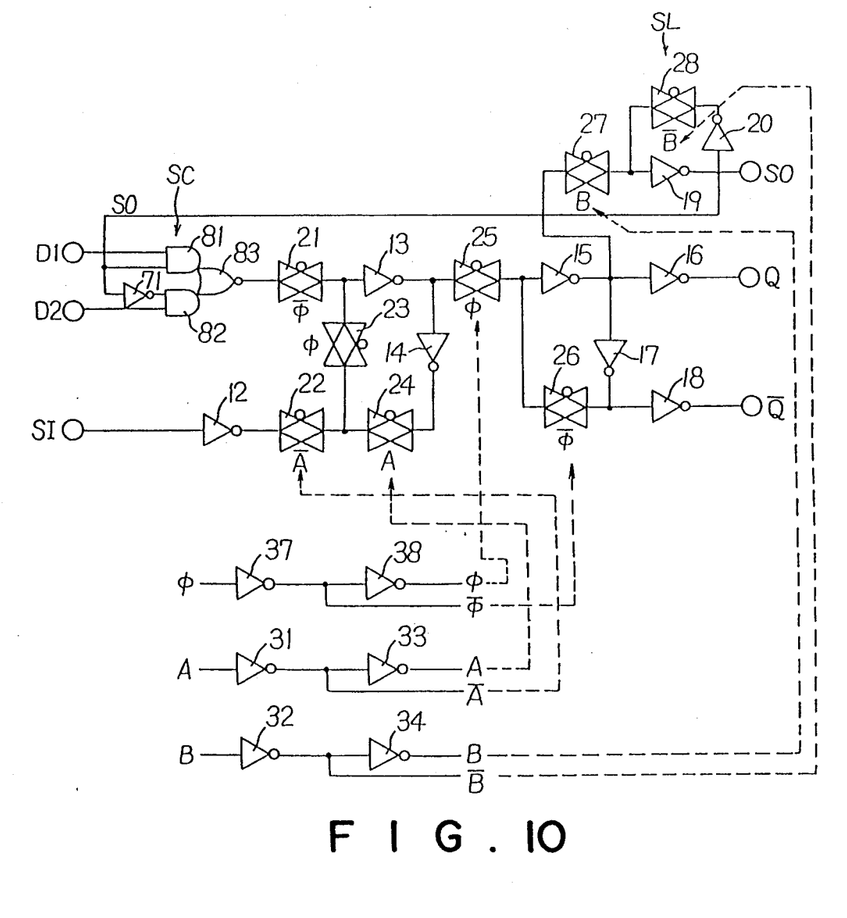
FIGS. 10 to 12 are circuit diagrams showing another embodiments of the present invention.

FIG. 10 shows an example of a scan flip-flop in which data inputs D1 and D2 are selectively inputted. In this example, there is shown a scan latch not used for the normal operation. Specifically, a scan data signal SO from a scan latch SL not used for the normal operation is used as a switching signal which is inputted to a selection circuit SC to selectively store one of the two input data D1 and D2. The selection circuit SC is constructed of an inverter 71, AND gates 81 and 82, and NAND gate 83. In this example, the scan data signal SO outputted from the scan latch SL can be set by a scan data signal SI while executing a predetermined operation after setting the mode.

It is also possible to select one of output signals Q and Q̄ used during the normal operation or one of test signals.

Figure 11:
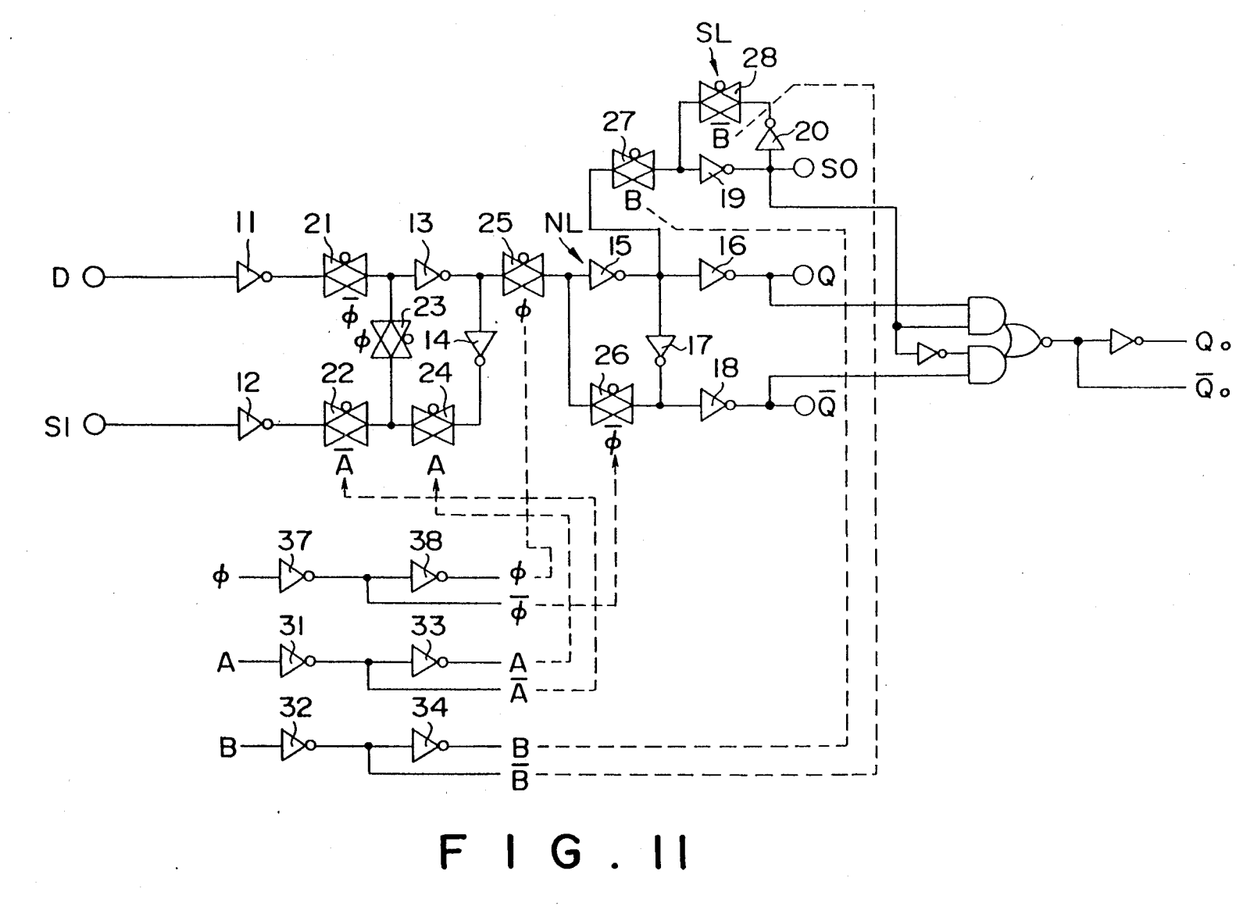
Figure 12:
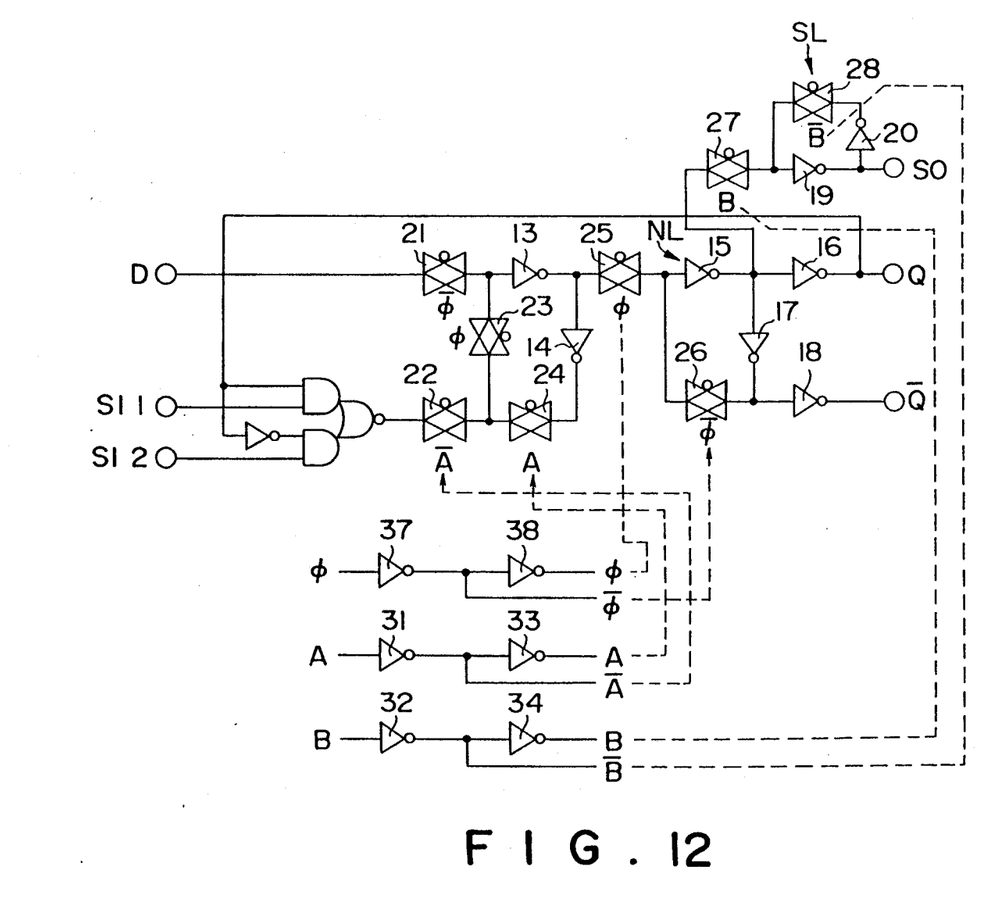

FIG. 11 shows an example of a circuit which selects one of output signals Q and Q̄. FIG. 12 shows an example of a circuit which selects one of test signals (scan data signals) SI1 and Si2.

In FIGS. 9 and 10, only partial flows of signals φ, φ̄, A, Ā, B, and B̄ are shown.

As described so far, according to the embodiments of this invention, it is possible to verify the timing margin of a data hold time of a large scale integrated logic circuit, the verification being very difficult if conventional techniques are used. Timing verification can be carried out easily by using a scan shift flip-flop. It is therefore possible to check the timing margin at the earlier stage. Furthermore, it is possible to provide a multifunctional scan flip-flop allowing the selection of a desired one of inputs or outputs.

What is claimed is:

1. A multifunctional scan flip-flop having a normal function and a scan function, comprising:
   a first latch used for a normal function for latching input data applied to a data input terminal during a normal function operation, said latch operation being carried out synchronous with a clock applied to a clock input terminal;
   a second latch used for a scan function for holding scan data applied to a scan data input terminal during a scan function operation; and
   delay means for delaying one of said input data and said clock relative to the other, said delay operation being enabled/disabled responsive to the H/L level of said scan data held and outputted by said second latch.

2. A flip-flop according to claim 1, wherein said delay means delays said clock relative to said input data.

3. A flip-flop according to claim 1, wherein said delay means delays said input data relative to said clock.

4. A flip-flop according to claim 2, wherein said delay means is interposed and connected between said clock input terminal and said first latch.

5. A flip-flop according to claim 3, wherein said delay means is interposed and connected between said data input terminal and said first latch.

6. A flip-flop according to claim 4, wherein said delay means includes first and second transistors (T1, T2) of a first conductivity type and third and fourth transistors (T3, T4) of a second conductivity type, said first to fourth transistors being connected in series between a power source terminal and a ground terminal, wherein:
   said clock is applied to the gates of said first and fourth transistors and to the input terminal of a first inverter (37), and a scan data signal in said second latch is directly applied to the gate of said second transistor and via a second inverter (35) to the gate of said third transistor; and
   an interconnection between said second transistor and third transistor and the output terminal of said first inverter (37) are connected together.

7. A flip-flop according to claim 5, wherein said delay means includes first and second transistors (T11, T12) of a first conductivity type and third and fourth transistors (T13, T14) of a second conductivity type, said first to fourth transistors being connected in series between a power source terminal and a ground terminal, wherein:
   said input data is applied to the gates of said first and fourth transistors and to the input terminal of a third inverter (11), and a scan data signal in said second latch is directly applied to the gate of said second transistor and via a fourth inverter (41) to the gate of said third transistor; and
   an interconnection between said second transistor and third transistor and the output terminal of said third inverter (11) are connected together.

8. A flip-flop according to claim 6, wherein a first circuit connecting said data input terminal to said first latch and a second circuit connecting said scan data input terminal to said second latch have in part the same circuit portion, and
   said first and second circuits each have a plurality of gate means at the intermediate circuit path thereof, said plurality of gate means being turned on and off by said clock and first and second control signals such that the connection/disconnection between said data input terminal and said first latch and between said scan data input terminal and said second latch is controlled as desired.

9. A flip-flop according to claim 7, wherein a first circuit connecting said data input terminal to said first latch and a second circuit connecting said scan data input terminal to said second latch have in part the same circuit portion, and
   said first and second circuits each have a plurality of gate means at the intermediate circuit path thereof, said plurality of gate means being turned on and off by said clock and first and second control signals such that the connection/disconnection between said data input terminal and said first latch and between said scan data input terminal and said second latch is controlled as desired.

10. A multifunctional scan flip-flop having a normal function and a scan function, comprising:
    input data selecting means for selecting and outputting one of a plurality of applied input data in accordance with a selection data;
    a first latch for latching input data outputted from said input data selecting means, said latch operation being carried out in synchronous with a clock applied to a clock input terminal; and
    a second latch for holding data applied to a scan data input terminal, said latch operation being carried out in synchronism with another clock, and said held data being outputted as said selection data.

11. A multifunctional scan flip-flop having a normal function and a scan function, comprising:
    a first latch for latching input data applied to a data input terminal and outputting said input data and the inverted data of said input data, said latch operation being carried out synchronous with a clock applied to a clock input terminal;
    a second latch for holding data applied to a scan data input terminal, said hold operation being carried out in synchronism with said clock, and said latched data being outputted as a selection data; and output data selecting means for selecting and outputting one of said input data and said inverted data respectively outputted from said first latch, in accordance with said selection data.

* * * * *